United States Patent [19]

Yuen

[11] Patent Number: 4,627,085
[45] Date of Patent: Dec. 2, 1986

[54] FLIP-FLOP CONTROL CIRCUIT

[75] Inventor: Raymond C. Yuen, San Diego, Calif.

[73] Assignee: Applied Micro Circuits Corporation, San Diego, Calif.

[21] Appl. No.: 626,401

[22] Filed: Jun. 29, 1984

[51] Int. Cl.[4] .................. G11C 7/00; H03K 17/26
[52] U.S. Cl. ............................. 377/81; 307/470; 307/480; 364/900
[58] Field of Search ............... 377/81; 307/470, 269, 307/480; 364/200, 900

[56] References Cited

U.S. PATENT DOCUMENTS

| 3,702,463 | 11/1972 | Lesniewski | 364/200 |
|---|---|---|---|
| 3,753,014 | 8/1973 | Kronies et al. | 307/470 |
| 3,828,258 | 8/1974 | Hills et al. | 377/81 |
| 3,970,995 | 7/1976 | Baudouin et al. | 364/900 |
| 3,997,800 | 12/1976 | Bain | 307/269 |
| 4,137,563 | 1/1979 | Tsunoda | 307/470 |
| 4,398,103 | 8/1983 | Derzawiec et al. | 307/470 |

OTHER PUBLICATIONS

Motorola Data Sheet for MC10141 Four-Bit Universal Shift Register.
Fairchild Data Sheet for F10141, F10541 Universal Shift Register.

Primary Examiner—John S. Heyman
Attorney, Agent, or Firm—Brown, Martin, Haller & Meador

[57] ABSTRACT

A circuit for controlling flip-flop hold and set-scan operations responds to one state of a HOLD/PASS signal by blocking the provision of a flip-flop CLOCK signal to one or more flip-flops which are to conduct a holding operation. The circuit responds to the pass state of the HOLD/PASS signal by permitting the flip-flop clock to be provided to the control flip-flops so that they can conduct shift or pass operations.

5 Claims, 4 Drawing Figures

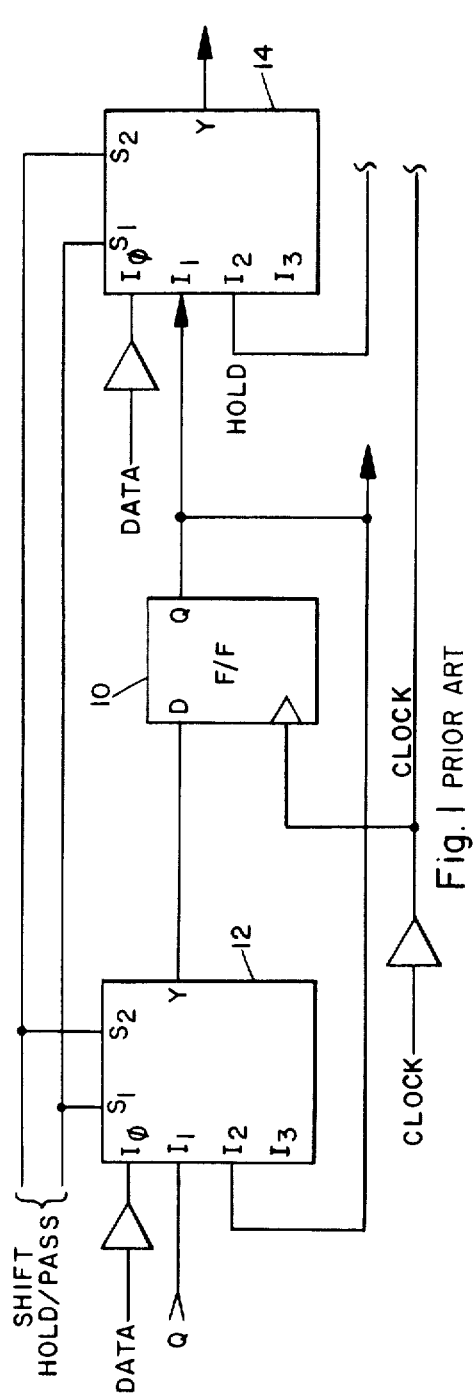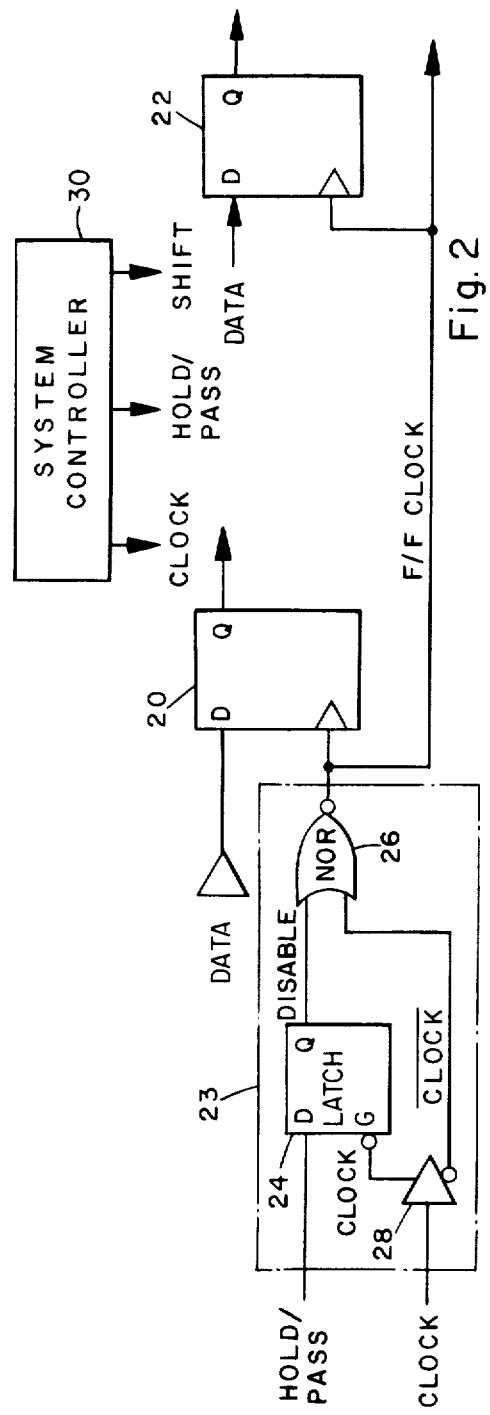

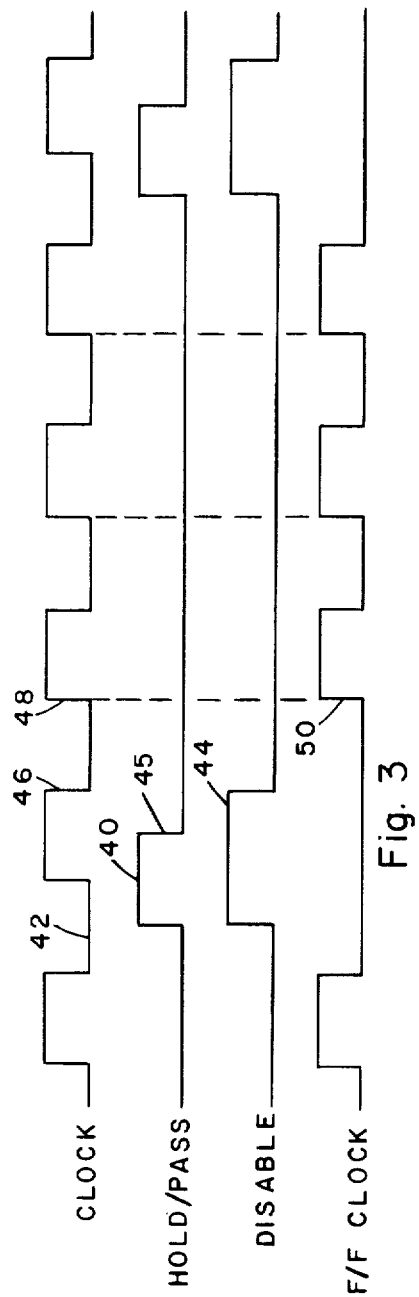
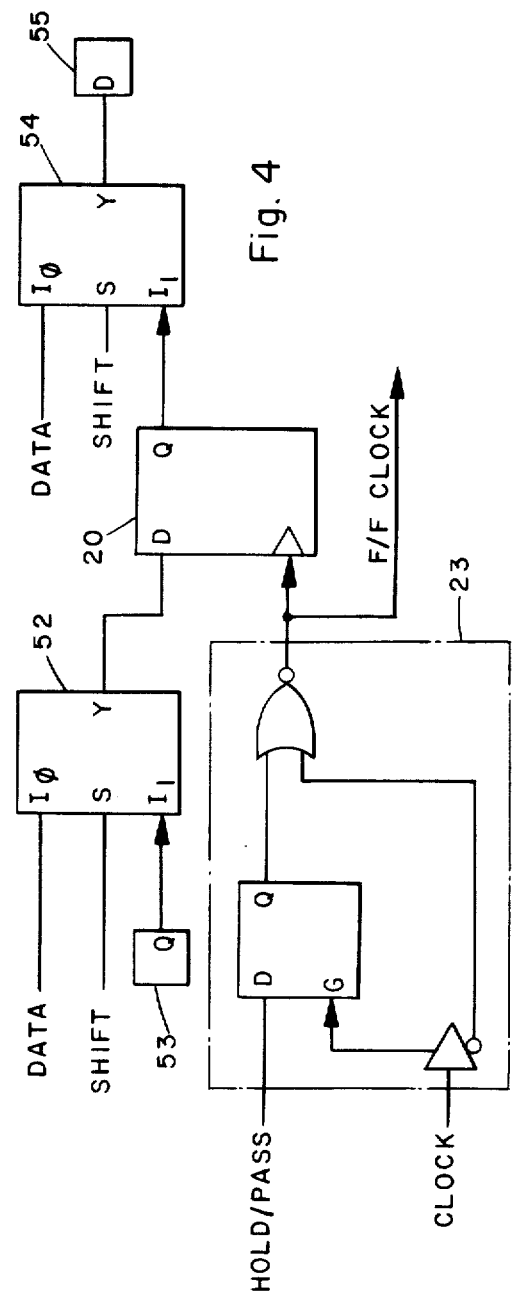

FLIP-FLOP CONTROL CIRCUIT

BACKGROUND OF THE INVENTION

The invention is in the field of digital circuits that control the operations of flip-flops.

Digital systems such as processors which employ flip-flops for signal processing or storage are characterized in having a hold operation during which the flip-flops are prevented from transferring stored data for one or more clock periods. For example, in a microcomputer system a typical NOP command requires digital circuitry including flip-flops to skip one or more system clock cycles and to perform no processing during the skipped cycles. the obverse of the hold operation is called the pass operation. During the pass operation, the flip-flops are permitted to accept and forward data. Frequently, these operations are referred to jointly as hold/pass.

In other digital equipments, which are used to conduct diagnostic testing of digital systems including sequentially connected flip-flops, a set-scan operation is implemented by propagating a data signal through the sequence of flip-flops. In this operation, each flip-flop is prevented from obtaining data from any source except another flip-flop preceding it in the sequence, thereby permitting a predetermined test data pattern to be shifted through the flip-flop sequence.

A conventional approach for selectively implementing the shift and hold/pass operations is illustrated in FIG. 1. The FIG. 1 circuit illustrates the control of a single flip-flop, but it can be generalized to control any number of associated flip-flops which are driven by a common CLOCK signal. In the FIG. 1 circuit, the input port D of a conventional storage flip-flop 10 is connected to receive the output of a four-line to one-line multiplexer 12. The output port Q of the flip-flop 10 is connected to one input of another multiplexer 14. The flip-flop 10 responds conventionally to a CLOCK signal by storing data present at port D during a transition of the CLOCK signal. In a typical data storage (pass) operation, a pair of control signals (SHIFT and HOLD/PASS) that are applied to the select ports $S_1$ and $S_2$ of the multiplexers 12 and 14, assume a state permitting data to pass from the input ports $I_0$ of the multiplexers to their output ports Y. This permits a DATA signal from a respective source to be applied directly to the D port of the flip-flop 10. Simultaneously, data stored during the previous storage transition of the CLOCK signal is provided at port Q of the flip-flop 10.

In the shift operation, corresponding to another respective state of the SHIFT and HOLD/PASS signals, data is transferred by the multiplexers 12 and 14 from their $I_1$ to their Y ports. If the $I_1$ port of each multiplexer is connected to the output port Q of an associated flip-flop, then a number of flip-flops can be serially connected to sequentially shift data with every storage transition of the CLOCK signal.

Finally, if a hold operation is selected by a third respective state of the SHIFT and HOLD/PASS signals, the output of each flip-flop will be connected to its input through its associated multiplexer. For example, when the hold state is selected, the multiplexer 12 will conduct a signal presented at port $I_2$ to port Y whence it will be conducted to port D of the flip-flop 10. Since port Q of the flip-flop 10 is connected to port $I_2$ of the multiplexer 12, the signal currently stored in the flip-flop 10 will be circulated back to its input port with the next storage transition of the CLOCK signal, effectively retaining the data in the flip-flop 10. In systems not requiring a shift operation, the hold and pass operations can be implemented by connecting port Y of a two-port to one-port multiplexer, controlled by the HOLD/PASS signal, to port Q of each flip-flop to be controlled.

It should be evident that the circuitry of FIG. 1 which controls the hold, pass, and shift operations of the flip-flop 10 requires the use of a multiplexer 12 for each flip-flop to be controlled. Since the number of input ports commonly provided in conventional multiplexers is a multiple of 2, it is evident that one port of each multiplexer is wasted when the three functions are implemented. Moreover, in the case where only the hold and pass functions are desired, each flip-flop must still have an associated two-port multiplexer. In either case, the excessive number of multiplexers consumes a great deal of silicon area in an integrated circuit, increases power consumption of the total circuit, and increases the difficulty of interconnecting the controlled series of flip-flops with each other and with respective data sources.

SUMMARY OF THE INVENTION

The present invention solves the problems of presently-available circuits which control hold, pass and shift operations for flip-flops by providing a single circuit which can control the hold/pass operation for any number of flip-flops.

A data storage flip-flop responsive to a CLOCK signal and to a DATA signal for storing the DATA signal in response to a storage transition of the CLOCK signal and transferring the stored DATA signal in response to a following transfer transition of the CLOCK signal has its hold/pass operations controlled by a gate circuit. The gate circuit can selectively assume one of two states. In the first, or hold state, after the CLOCK signal transition stimulating storage of data, the gate circuit blocks further CLOCK signals from the flip-flops. This effectively prevents further data entry into the flip-flops and retains already entered data in the flip-flops. In its second, or pass state, the gate means permits the CLOCK signal to be provided to the controlled flip-flops. The flip-flops are then free to operate conventionally.

The gate circuit of the invention includes a latch that responds to the CLOCK signal and to a HOLD signal representative of the hold operation by providing, when the HOLD signal is activated, a DISABLE signal after a storage-enabling but before the next-following transfer-enabling CLOCK signal transition. The gate circuit further includes a NOR gate which receives the CLOCK and DISABLE signals to assume a blocking state, during which its output assumes a constant level when the DISABLE signal is activated. When the DISABLE signal is deactivated, the NOR gate provides an output signal corresponding to the CLOCK signal that is provided to the controlled flip-flops.

The circuit is expanded to include the shift operation by providing, for each flip-flop controlled by the gate circuit, a two-input multiplexer which is connected to provide either a data signal from a source outside the flip-flops or the output of one of the controlled flip-flops. The output of the multiplexer is connected to provide data to another of the controlled flip-flops. Conductivity is provided between a respective one of the input ports and the output port of the multiplexer according to the state of the SHIFT signal.

Therefore, it is a principal object of the present invention to provide an improved circuit for controlling operations of a flip-flop.

It is a further object of the invention to provide such a circuit which controls the hold operations of a plurality of flip-flops.

Other objects and attendant advantages of the present invention will become more evident when the following detailed description is read in conjunction with the drawings.

BRIEF DESCRIPTION OF THE DRAWINGS

FIG. 1 is a circuit diagram illustrating a currently-available flip-flop control circuit.

FIG. 2 is a circuit diagram illustrating the circuit of the invention in an operational environment controlling plural flip-flops.

FIG. 3 is a waveform diagram illustrating the operation of the invention.

FIG. 4 is a circuit diagram illustrating the circuit of the invention in combination with plural circuits that control the shift operations of one or more of a series of flip-flops.

DETAILED DESCRIPTION OF THE PREFERRED EMBODIMENT

An improved flip-flop control circuit for implementing the hold and pass functions of one or more of a group of associated flip-flops is described. In the following description, for purposes of explanation, specific logic devices are set forth in order to provide a thorough understanding of the principles of the described invention. However, it should be obvious to one skilled in the art that the invention may be practiced without these specific devices.

Referring now to FIG. 2, one or more of a plurality of flip-flops, two of which are indicated by 20 and 22, are illustrated under the control of the circuit of the invention, which is enclosed in the dashed line indicated by 23. Each flip-flop has a port D through which it receives a data signal that is entered into and stored in the flip-flop during a transition of one polarity of a CLOCK signal F/F CLOCK. This transition is referred to as a "storage transition". On the following oppositely-directed transition (called a "transfer transition"), the stored data signal is provided at the output port Q of each flip-flop. Each of the flip-flops will retain or store its data signal until the following storage-enabling transition of F/F CLOCK.

The circuit of the invention includes a conventional digital latch 24 having an input port D which is connected to receive a HOLD/PASS signal. The latch 24 has an output port Q which provides a DISABLE signal to a NOR gate 26. A buffer 28 has an input connected to receive a CLOCK signal which the buffer provides from a non-inverting port to the enable port G of the latch 24. The buffer 28 also has an inverting output port through which an inverted version of the CLOCK signal is provided as CLOCK. This inverted signal is provided as a second input to the NOR gate 26. The output of the NOR gate 26 is connected to the clock input port of each of the flip-flops whose operations are to be controlled.

The HOLD/PASS and CLOCK signals can be conventionally provided from a system controller 30, such as a microprocessor, or from any other appropriate source or combination of sources. The CLOCK signal is a conventional oscillating digital clock signal which is used to synchronize the operations of the flip-flops to be controlled as well as the operation of other associated logic. The HOLD/PASS signal can have a conventional binary digital format. In the preferred embodiment, the positive voltage state of the HOLD/PASS signal is representative of a hold operation, while the zero voltage state of the signal indicates that the controlled flip-flops are to operate conventionally.

With reference now to FIGS. 2 and 3 together, the operation of the circuit of the invention can be understood. When the HOLD/PASS signal waveform assumes a positive level at 40, the transition to be zero voltage level of the CLOCK signal waveform at 42, which is inverted before entering port G, causes the DISABLE signal waveform to assume a positive state at the output port Q of the latch. This is indicated by section 44 of the DISABLE waveform.

The positive section 44 of the DISABLE signal waveform prevents the NOR gate 26 from responding to the oscillations of the CLOCK signal provided by the inverting output of the buffer 28. During this time, the output of the NOR gate 26 is driven to the zero voltage binary level, which prevents data being entered into and transferred out of the flip-flops 20 and 22. This effectively retains in the flip-flops the data that was entered at the prior storage-enabling transition.

As illustrated in FIG. 3, the HOLD/PASS signal waveform transitions to the zero voltage binary state at 45, causing the DISABLE signal waveform to fall to the zero voltage level concurrently with transition 46 of the clock waveform. This enables the NOR gate 26 to oscillate in phase with the CLOCK waveform beginning with the CLOCK waveform transition 48. Thus, while the DISABLE signal is deactivated, the F/F CLOCK signal is provided to the flip-flops 20 and 22, permitting them to operate conventionally. Since, when the DISABLE signal is deactivated, the F/F CLOCK signal results from the double inversion of the CLOCK signal through the buffer 28 and the NOR gate 26, the operations of the flip-flops 20 and 22 are positively synchronized with other digital devices operating off of the CLOCK signal.

With reference now to FIG. 4, the effect of the circuit of the invention in reducing the total circuitry required to implement the hold, pass, and shift operations is illustrated. In FIG. 4, the flip-flop 20 is connected as taught in FIG. 2 to the circuit 23 of the invention. A two-input to one-output multiplexer 52 has its output port Y connected to port D of the flip-flop 20. In addition, the input ports $I_0$ and $I_1$ are connected to a DATA signal from an independent data source and the output port Q of another flip-flop 53, respectively. The select port S of the multiplexer 52 receives a SHIFT signal. The output port Q of the flip-flop 20 is connected to the input port $I_1$ of another multiplexer 54 whose other input port $I_0$ is connected to receive another DATA signal from another independent data source. The output port Y of the multiplexer 54 is connected to the input port D of another flip-flop 55. Although not illustrated in FIG. 4, both flip-flops 53 and 55, as well as the flip-flop 20, are connected at their clock input ports to the F/F CLOCK signal. With the FIG. 4 circuit, when the SHIFT and HOLD/PASS signals are simultaneously deactivated, the flip-flops are permitted to operate in conventional clocked fashion. In this case, the state of the SHIFT signal will permit data to be entered from the independent data sources through the I₀ ports of the multiplexers 52 and 54 into the associated flip-flops and in synchronism with the F/F CLOCK signal. Next, while the HOLD/PASS signal is still in the pass state, the SHIFT signal is activated, initiating the shift operation. In the shift operation each flip-flop will receive data from the output port of another flip-flop through the I₁ port of the multiplexer tied to its input port, permitting data to be shifted from one to another flip-flop under the control of and in synchronization with the F/F CLOCK signal.

Obviously, many modifications and variations of the present invention are possible in light of the above teachings, and it is therefore understood that within scope of the disclosed inventive concept, the invention may be practiced otherwise than as specifically described.

I claim:

1. A circuit for transferring data in response to a CLOCK signal in which a HOLD signal selectively prevents data transfer, comprising:

data storage means responsive to an oscillating binary CLOCK signal for receiving and storing a data signal in response to a CLOCK signal transition in a first direction, transferring a stored data signal in response to a CLOCK signal transition in a second direction, and holding a stored data signal until the occurrence of a CLOCK signal transition in said second direction;

latch means responsive to said CLOCK signal and to a binary HOLD signal for providing one state of a binary DISABLE signal in response to a hold state of said HOLD signal and for providing a second state of said DISABLE signal in response to a pass state of said HOLD signal, said latch means transitioning between said first and second DISABLE signal states in synchronism with said CLOCK signal; and a single gate responsive to said CLOCK signal and said DISABLE signal for blocking the provision of said CLOCK signal to said data storage means when said DISABLE signal has said first state and for providing said CLOCK signal to said data storage means when said DISABLE signal has said second state.

2. The circuit of claim 1 further including a plurality of said data storage means, each connected to receive said CLOCK signal from said gate means.

3. The circuit of claim 1 further including a data selection means for selectively connecting said data storage means to a selected one of a plurality of data signal sources.

4. The circuit of claim 2 further including a data selection means for selectively connecting said data storage means to a selected one of a plurality of data signal sources.

5. The circuit of claim 4 wherein one of said plurality of data sources is one of said plurality of data storage means.

* * * * *